(12) United States Patent
Smith et al.

(10) Patent No.: US 8,624,666 B2
(45) Date of Patent: Jan. 7, 2014

(54) INTERLEAVED NOISE REDUCTION CIRCUIT AND METHOD

(75) Inventors: Robert B. Smith, Pocatello, ID (US);
Stan Latimer, Pocatello, ID (US);
Morgan Ercanbrack, Arimo, ID (US)

(73) Assignee: Semiconductor Components Industries, LLC, Phoenix, AZ (US)

( * ) Notice: Subject to any disclaimer, the term of this patent is extended or adjusted under 35 U.S.C. 154(b) by 62 days.

(21) Appl. No.: 13/330,670

(22) Filed: Dec. 19, 2011

(65) Prior Publication Data
US 2013/0154724 A1 Jun. 20, 2013

(51) Int. Cl.
*H03K 5/00* (2006.01)

(52) U.S. Cl.
USPC .......................................... 327/551; 327/552

(58) Field of Classification Search
USPC .......................................... 327/551–559, 34
See application file for complete search history.

(56) References Cited

U.S. PATENT DOCUMENTS

| | | | |
|---|---|---|---|
| 5,410,145 A * | 4/1995 | Coroy | 250/214 C |
| 5,554,944 A * | 9/1996 | Van Buul et al. | 327/91 |
| 7,957,762 B2 | 6/2011 | Herz et al. | |
| 8,017,901 B2 * | 9/2011 | Mizoguchi et al. | 250/214 R |

* cited by examiner

*Primary Examiner* — Dinh T. Le
(74) *Attorney, Agent, or Firm* — Rennie William Dover

(57) ABSTRACT

In accordance with an embodiment, a noise reduction circuit includes one or more phase sampling circuits that receive an electromagnetic signal and splits the signal into an illuminated component and an ambient component. The illuminated component is transmitted along an illuminated signal path and converted to a digital signal and the ambient component is transmitted along an ambient signal path and converted to a digital signal. The digitized ambient component is subtracted from the digitized illuminated component to generate a light signal with a reduced noise component.

23 Claims, 3 Drawing Sheets

INTERLEAVED NOISE REDUCTION CIRCUIT AND METHOD

BACKGROUND

The present invention relates, in general, to electronics and, more particularly, to noise reduction in electronic circuits.

In the past, the electronics industry used various techniques to determine the proximity of two objects to each other. For example, in portable communications applications such as telephones it is desirable to determine the distance between the telephone and its user's head so that the telephone's touch panel can be turned off as the telephone approaches the head, but before the phone touches the head. In these types of applications active optical proximity sensors may be employed to detect the proximity between the telephone and the user's head. Active proximity sensors include a light source that transmits light to the user's head and a sensor that detects the light reflected from the user's head. Proximity sensors are disclosed in U.S. Pat. No. 7,957,762 issued to Scott M. Herz et al. on Jun. 7, 2011. A drawback with these types of systems is that the reflected light signal typically includes noise that degrades the accuracy of the measurement. Noise caused by sunlight and low frequency light sources may be reduced by transmitting the light in a series of pulses with a frequency higher than the interfering light sources and using a high pass filter to allow transmission of the light being transmitted at higher frequencies. This technique uses additional circuitry, increases power consumption, and may introduce additional sources of noise.

Accordingly, it would be advantageous to have a noise reduction circuit for optical applications and a method for reducing noise in the optical applications. In addition, it is desirable for the method and circuit to be cost and time efficient to implement.

BRIEF DESCRIPTION OF THE DRAWINGS

The present invention will be better understood from a reading of the following detailed description, taken in conjunction with the accompanying drawing figures, in which like reference characters designate like elements and in which.

Figure 1:
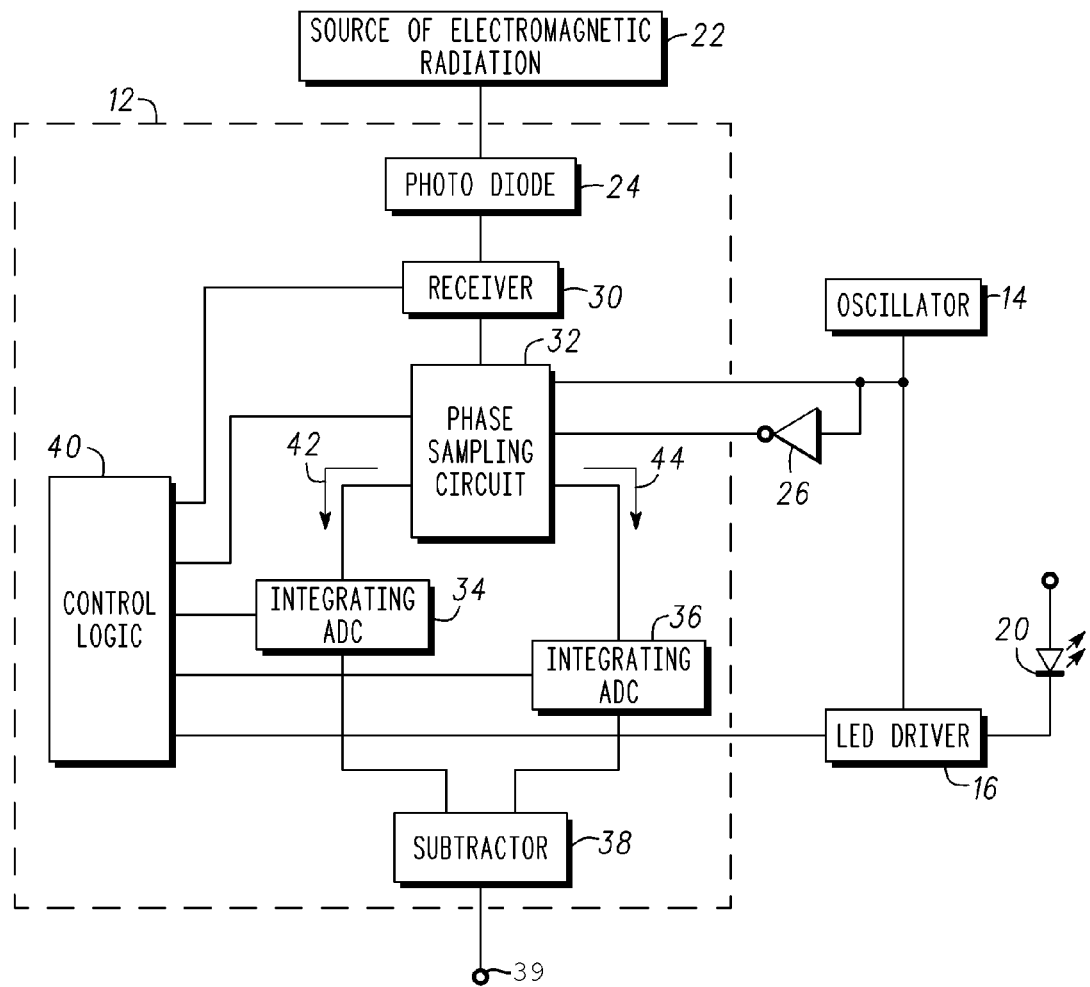
FIG. 1 is a block diagram of a noise reduction circuit in accordance with an embodiment of the present invention.

For simplicity and clarity of illustration, elements in the figures are not necessarily to scale, and the same reference characters in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or an anode of a diode, and a control electrode means an element of the device that controls current flow through the device such as a gate of an MOS transistor or a base of a bipolar transistor. Although the devices are explained herein as certain N-channel or P-channel devices, or certain N-type or P-type doped regions, a person of ordinary skill in the art will appreciate that complementary devices are also possible in accordance with embodiments of the present invention. It will be appreciated by those skilled in the art that the words during, while, and when as used herein are not exact terms that mean an action takes place instantly upon an initiating action but that there may be some small but reasonable delay, such as a propagation delay, between the reaction that is initiated by the initial action and the initial action. The use of the words approximately, about, or substantially means that a value of an element has a parameter that is expected to be very close to a stated value or position. However, as is well known in the art there are always minor variances that prevent the values or positions from being exactly as stated. It is well established in the art that variances of up to about ten percent (10%) (and up to twenty percent (20%) for semiconductor doping concentrations) are regarded as reasonable variances from the ideal goal of exactly as described.

It should be noted that a logic zero voltage level ($V_L$) is also referred to as a logic low voltage and that the voltage level of a logic zero voltage is a function of the power supply voltage and the type of logic family. For example, in a Complementary Metal Oxide Semiconductor (CMOS) logic family a logic zero voltage may be thirty percent of the power supply voltage level. In a five volt Transistor-Transistor Logic (TTL) system a logic zero voltage level may be about 0.8 volts, whereas for a five volt CMOS system, the logic zero voltage level may be about 1.5 volts. A logic one voltage level ($V_H$) is also referred to as a logic high voltage level and, like the logic zero voltage level, the logic high voltage level also may be a function of the power supply and the type of logic family. For example, in a CMOS system a logic one voltage may be about seventy percent of the power supply voltage level. In a five volt TTL system a logic one voltage may be about 2.4 volts, whereas for a five volt CMOS system, the logic one voltage may be about 3.5 volts.

DETAILED DESCRIPTION

Generally the present invention provides an interleaved noise reduction circuit and a method for reducing noise. In accordance with embodiments, illuminated and ambient electromagnetic radiation measurements are taken during the time a source of electromagnetic radiation such as, for example, a light emitting diode (LED) is being modulated by synchronous phase sampling of a received electromagnetic radiation signal. It should be noted that the received electromagnetic radiation signal is comprised of an illuminated component and a noise component, wherein the noise component may be referred to as an ambient component. In an example where the electromagnetic radiation is light, the received electromagnetic radiation signal is comprised of an illuminated light component and an ambient light component. It should be noted that the signal intensity of the received light may span several decades. It should be further noted that the electromagnetic radiation is not limited to being visible light. The electromagnetic radiation signals may be radiowaves, microwaves, infrared radiation, ultraviolet radiation, X-rays, gamma rays, etc. A receiver receives the electromagnetic radiation signal, filters undesired frequency components from the electromagnetic radiation signal and amplifies the signal. The filtered and amplified electromagnetic radiation signal is transmitted to one or more phase splitters, which split the electromagnetic radiation signal into on-time and off-time components and processes them in separate analog channels into illuminated and ambient components. The illuminated component is a combination of a signal portion and a noise portion, i.e., the ambient component. After generating the illuminated and ambient components, the components are converted into digital signals in preparation for digital subtraction. The ambient component is digitally subtracted from the illuminated component, leaving the signal component.

FIG. 1 is a block diagram of a noise reduction portion 10 of a proximity sensor in accordance with an embodiment of the present invention. Noise reduction portion 10 includes a noise reduction circuit 12 coupled to an oscillator 14 and a driver circuit 16. By way of example, the electromagnetic radiation signal is a light signal generated by an LED 20 and driver circuit 16 is an LED driver circuit. LED 20 is connected to LED driver circuit 16 and transmits the light signal to an object whose proximity is to be sensed. The anode of LED 20 may be coupled for receiving a source of operating potential. The light signal transmitted by the LED is reflected from the object as a reflected light or electromagnetic radiation signal 22, which is transmitted to a photodiode 24 of noise reduction circuit 12. Thus, reflected electromagnetic radiation signal 22 represents the electromagnetic radiation signal that is transmitted from LED 20 and reflected back to noise reduction circuit 12 from an object or person. As discussed above, the type of electromagnetic radiation is not limited to light in the visible spectrum. In accordance with an embodiment, noise reduction circuit 12 includes a photodiode 24, a receiver 30, a phase sampling circuit 32, an integrating Analog-to-Digital Converter (ADC) 34, an integrating Analog-to-Digital Converter (ADC) 36, a subtractor or difference circuit 38, and control logic circuitry 40. By way of example, receiver 30 may be comprised of a filter circuit and an amplifier circuit. Alternatively, receiver 30 may include a rectifying or signal adjustment circuit in addition to the filter and amplifier circuits.

It should be noted that the configurations of integrating ADC's 34 and 36 are not limitations of the present invention. Integrating ADC's 34 and 36 can be implemented using an integrating current-to-frequency converter, a combination of an integrator and a dual slope ADC, a combination of an integrator and a conventional voltage ADC, or the like. Those skilled in the art understand that a combination of an integrator and an ADC may be referred to as an integrating ADC.

Phase sampling circuit 32 is coupled to receive an output signal ($V_{CLK}$) from oscillator 14 and an inverted output signal ($V_{CLK}B$) from oscillator 14 through inverter 26. The output signal $V_{CLK}$ from oscillator 14 is also transmitted to LED driver 16.

Figure 2:
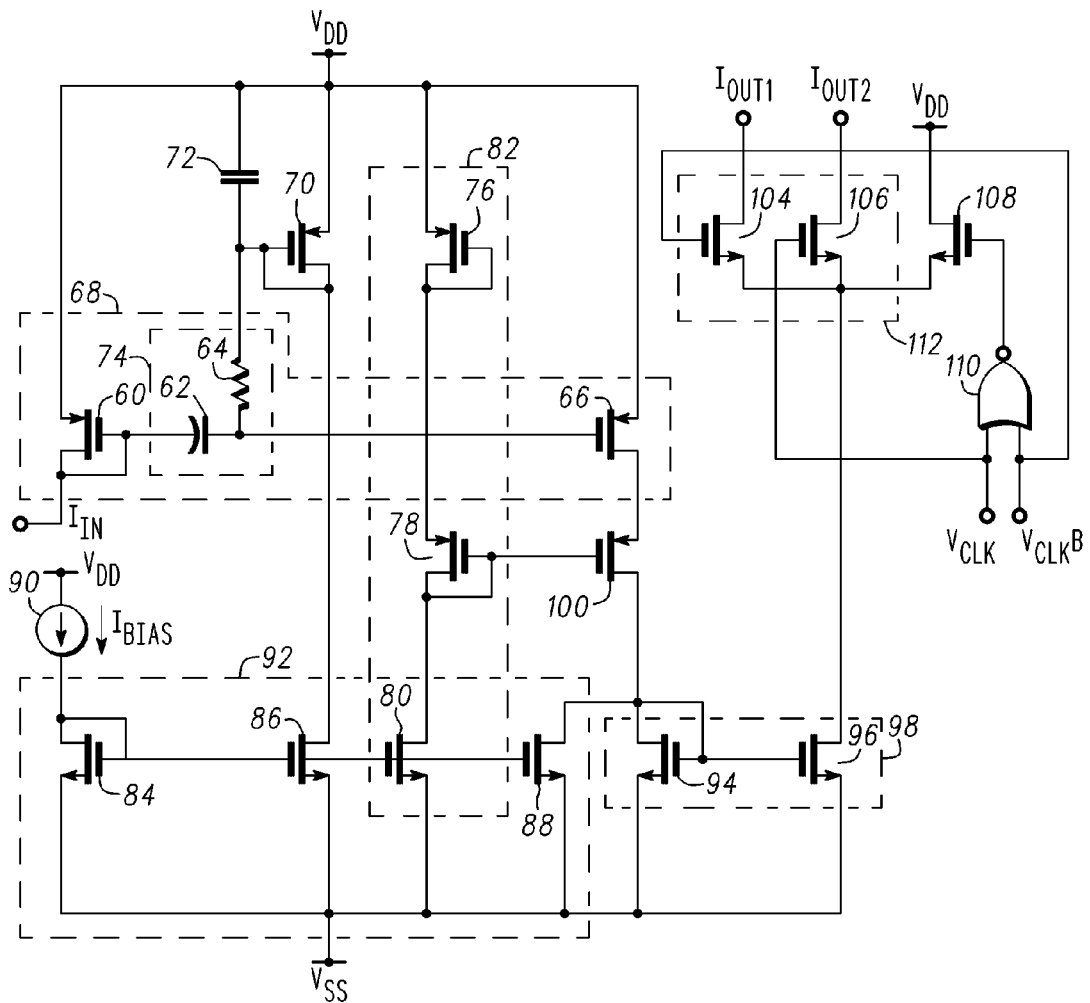
FIG. 2 is a circuit schematic of a portion of the noise reduction circuit of FIG. 1 in accordance with an embodiment of the present invention.

Phase sampling circuit 32 separates the light signal into illuminated and ambient components, transmits the illuminated component along a signal path 42 that includes integrating ADC 34, and transmits the ambient component along a signal path 44 that includes integrating ADC 36. Referring now to FIG. 2, a circuit schematic of phase sampling circuit 32 in accordance with an embodiment is illustrated. What is shown in FIG. 2 is a field effect transistor 60 having a drain electrode connected to a gate electrode and a source electrode coupled for receiving a source of operating potential $V_{DD}$. The commonly connected drain and gate electrodes serve as an input terminal for phase sampling circuit 32. The gate electrode of field effect transistor 60 is connected to the gate electrode of a field effect transistor 66 through a capacitor 62. Field effect transistor 66 has a source electrode and a drain electrode, where the source electrode is coupled for receiving source of operating potential $V_{DD}$. Phase sampling circuit 32 further includes a field effect transistor 70 having a gate electrode coupled to the gate electrode of field effect transistor 66 through a resistor 64 and coupled for receiving source of operating potential $V_{DD}$ through a capacitor 72. Field effect transistors 60 and 66, capacitor 62, and resistor 64 form a filtering current mirror 68, where capacitor 62 and resistor 64 form a high pass filter.

In addition, phase sampling circuit 32 includes field effect transistors 76, 78, and 80 configured as a current bias network 82, wherein field effect transistor 76 has a source electrode coupled for receiving source of operating potential $V_{DD}$ and a gate electrode coupled to its drain electrode. Current bias network 82 may be referred to as a bias circuit or a bias stage. Field effect transistor 78 has a source electrode connected to the commonly connected drain and gate electrodes of field effect transistor 76 and gate and drain electrodes that are commonly connected to each other and to the drain electrode of field effect transistor 80. The gate electrode of field effect transistor 80 is commonly connected to the gate electrodes of field effect transistors 84, 86, and 88. The source electrodes of field effect transistors 84, 86, and 88 are coupled for receiving source of operating potential $V_{SS}$. The drain electrode of field effect transistor 84 is coupled for receiving source of operating potential $V_{DD}$ through a current source 90. Current source 90 provides a bias current $I_{BIAS}$. The drain electrode of field effect transistor 86 is connected to the commonly connected drain and gate electrodes of field effect transistor 70. Field effect transistors 84, 86, 80, and 88 form a current mirror 92.

Phase sampling circuit 32 includes a pair of field effect transistors 94 and 96 configured as a current mirror 98, wherein the gate electrodes of field effect transistors 94 and 96 are commonly connected together and to the drain electrode of field effect transistor 94 and the source electrodes of field effect transistors 94 and 96 are coupled for receiving source of operating potential $V_{SS}$. The drain electrode of field effect transistor 94 is connected to the drain electrode of field effect transistor 66 of current mirror 68 through a field effect transistor 100, wherein the drain electrode of field effect transistor 100 is connected to the drain electrode of field effect transistor 94, the source electrode of field effect transistor 100 is connected to the drain electrode of field effect transistor 66, and the gate electrode of field effect transistor 100 is connected to the commonly connected gate and drain electrodes of field effect transistor 78.

Phase sampling circuit 32 includes field effect transistors 104, 106, and 108 that have source electrodes commonly connected to the drain electrode of field effect transistor 96. The gate electrodes of field effect transistors 104 and 106 are connected to corresponding input terminals of a two-input NOR gate 110, the gate terminal of field effect transistor 108 is connected to the output terminal of two-input NOR gate 110, and the drain terminal of field effect transistor 108 is coupled for receiving source of operating potential $V_{DD}$. The input terminals of two-input NOR gate 110 are coupled for receiving the clock signal $V_{CLK}$ and the inverted clock signal $V_{CLK}B$ from oscillator 14. The drain terminals of field effect transistors 104 and 106 serve as the output terminals of phase sampling circuit 32. Field effect transistors 104 and 106 form an output stage 112

In operation, phase sampling circuit 32 receives the light signal represented as a current from receiver 30. The current signal is filtered by high pass filter 74 to remove any residual DC signal that may be present in the signal from receiver 30 and mirrored by current mirror 68. Field effect transistor 70 sets a reference voltage for high pass filter 74 and bias circuit 82 adds additional current that is mirrored into current mirror 68. Thus, filter 74 removes a DC current signal that interferes with the AC current signal, which AC current signal includes the illuminated and ambient components. Because the AC signal may have a large dynamic range that can span several decades of current and the illuminated signal level may be much smaller than the ambient signal level, bias circuit 82 is included to inject a known DC current to center the AC signal and provide a sufficient dynamic range for the AC signal between the supply rails. The additional DC current and the AC current are transmitted to the input or front end of the current mirror 98. If the current transmitted to the input of current mirror 98 is not reduced, a large mirrored current would be generated that represents an error signal. To reduce the error signal, field effect transistor 88 is included to divert the additional current provided by bias circuit 82. Thus, bias circuit 82 adds a current and field effect transistor 88 subtracts the majority of the current added by bias circuit 82.

Current mirror 98 generates a current that is steered through field effect transistors 104 and 106 in accordance with the signals $V_{CLK}$ and $V_{CLK}B$ from oscillator 14. The current flowing through field effect transistor 104 serves as the illuminated component and the current flowing through field effect transistor 106 serves as the ambient component.

Figure 3:
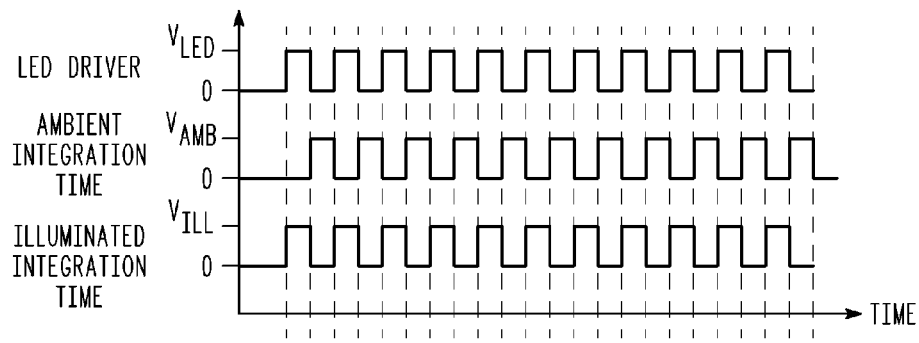
FIG. 3 is a timing diagram in accordance with an embodiment of the present invention.

In operation, LED driver circuit 16 drives LED 20 at a frequency sufficiently high to discern it from other noise or interference sources. LED 20 generates a signal that is reflected back to photodiode 24, which is responsive to the wavelength of the signal produced by LED 20. Receiver 30 receives the reflected signal and filters it with, for example, a high pass filter to reject low frequency noise signals. Receiver 30 amplifies the filtered signal to generate the illuminated component of the light signal and transmits the illuminated component to phase sampling circuit 32. Phase sampling circuit 32 separates the illuminated component into the signal component and the ambient component in response to oscillator signals from oscillator 14 and control signals received from control logic circuitry 40. By way of example, the illuminated component may be separated in accordance with the time that the light source is on, i.e., the portion that contains the signal plus ambient components, and the time that the light source is off, i.e., the portion containing the ambient component. The illuminated component, which includes the signal plus ambient components, is transmitted along signal path 42 and the ambient component is transmitted along signal path 44. It should be noted that in response to the oscillator signal, LED driver 16 generates an LED status indicator signal $V_{LED}$ shown in plot 120 of FIG. 3 that indicates the state of LED 20, i.e., whether LED 20 is on or off.

In response to the inverted oscillator signal and the illuminated component transmitted to illuminated signal path 42, phase sampling circuit 32 samples the illuminated signal from receiver 30. Typically, the light signal received from a given light pulse is very small, thus the light energy is accumulated over a series of pulses. The accumulated charge from the illuminated light signal may be stored using the integrator portion of integrating ADC 34 and converted to a digital signal using the analog-to-digital converter (ADC) portion of integrating ADC 34. The integrator portion may be implemented as a capacitor. By way of example, the sampled signal is integrated over the time that LED 22 is on. The digital signal generated by integrating ADC 34 is representative of the illuminated signal and is transmitted to subtractor circuit 38. The illuminated signal includes the light signal and noise from "in-band" ambient light sources and on-chip noise generated by, for example, LED driver 16 switching from an on state to an off state or from an off state to an on state.

In response to the noninverted oscillator signal and the ambient component transmitted to illuminated signal path 44, phase sampling circuit 32 samples the illuminated signal from receiver 30. As discussed above, the light signal received from a given light pulse is very small, thus the light energy is accumulated over a series of pulses. The accumulated charge from the ambient light signal may be stored using the integrator portion of integrating ADC 36 and converted to a digital signal using the analog-to-digital converter (ADC) portion of integrating ADC 36. The digital signal generated by integrating ADC 36 is representative of the ambient light signal and is transmitted to subtractor circuit 38. Like the illuminated light signal, the ambient light signal includes noise from "in-band" ambient light sources and on-chip noise generated by, for example, LED driver 16 switching from an on state to an off state or from an off state to an on state. However, the light signal itself is absent from the ambient light signal.

Subtractor 38 subtracts the ambient light signal from the illuminated light signal to generate a digital light signal having a reduced noise level at its output terminal 39. It should be noted that control logic 40 controls the timing of the signal transmission along signal paths 42 and 44. Referring again to FIG. 3, plot 120 further illustrates that the illumination integration time occurs in response to LED drive circuit 16 generating an assertion signal that indicates when LED 20 is on and that the ambient integration time occurs in response to LED drive circuit 16 generating a non-assertion signal indicating when LED 20 is off.

Figure 4:
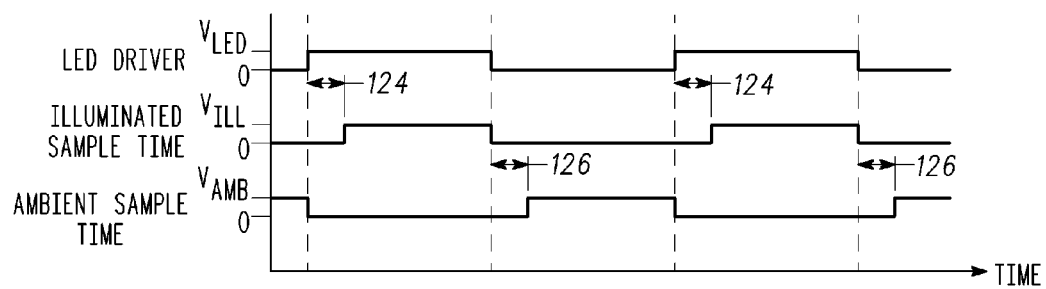
FIG. 4 is a timing diagram in accordance with another embodiment of the present invention.

FIG. 4 is a timing diagram 122 in accordance with another embodiment of the present invention. Because LED driver circuit 16 generates large amounts of noise in response to switching on and off and because filtering of the light signal may introduce group delay, it may be desirable to delay the sampling of the signal from receiver 30. FIG. 4 illustrates that a portion 124 of the illuminated sampling time and a portion 126 of the ambient sampling time may be blanked or discarded. Delaying the sampling time ensures that sampling does not occur along illuminated signal path 42 at the time LED driver circuit 16 turns on or is asserted, i.e., transitions to a logic high state, or along ambient signal path 44 at the time LED driver circuit 16 turns off or is de-asserted, i.e., transitions to a logic low state. Sampling just before LED driver circuit 16 turns on or turns off ensures that bad data caused by, for example, the filter group delay that may skew the pulse is not sampled. It should be noted that the delayed signals replace the $V_{CLK}$ and $V_{CLK}B$ signals with signals $V_{ILL}$ and $V_{AMB}$, respectively.

By now it should be appreciated that a noise reduction circuit and method have been provided. In accordance with embodiments, the illuminated signal is processed as if subtraction would not occur. Prior to integration, the signal is split into a component which represents the ambient content and a signal which represents the illuminated content plus the ambient content. Synchronous phase sampling can be accomplished because the time at which LED 22 is on is known. The split signals are integrated and converted into digital signals separately from each other, but substantially simultaneously with each other. Because the two signals are processed at substantially the same time, they may be referred to as interleaved signals. The interleaved signals may be processed through a difference circuit to reduce the noise in the illuminated signal.

Although specific embodiments have been disclosed herein, it is not intended that the invention be limited to the disclosed embodiments. Those skilled in the art will recognize that modifications and variations can be made without departing from the spirit of the invention. It is intended that the invention encompass all such modifications and variations as fall within the scope of the appended claims.

What is claimed is:

1. A noise reduction circuit, comprising:
a phase sampling circuit responsive to a stream of pulses of known phase and frequency and having an input and first and second outputs, the first output configured to transmit a first component of a first signal along a first signal path and the second output configured to transmit a second component of the first signal along a second signal path; and
a difference circuit having a first input coupled for receiving the first component of the first signal, a second input for receiving the second component of the first signal, and an output.

2. The noise reduction circuit of claim 1, further comprising a receiver coupled for receiving an input signal and having an output through which the first signal is transmitted.

3. The noise reduction circuit of claim 2, further comprising an oscillator having an output coupled to the first signal path through an inverter and coupled to the second signal path.

4. The noise reduction circuit of claim 1, wherein the first signal path comprises
a first integrating analog-to-digital circuit having an input and an output, the input of the first integrating analog-to-digital circuit coupled to the first output of the phase sampling circuit.

5. The noise reduction circuit of claim 4, wherein the phase sampling circuit comprises:
a filtering current mirror having an input terminal and an output terminal;
a bias circuit coupled to the output terminal;
a first current mirror having an input terminal and an output terminal, the output terminal coupled to the output terminal of the filtering current mirror;
a second current mirror having an input terminal and an output terminal, the input terminal coupled to the output terminal of the filtering current mirror; and
an output stage having first and second output terminals, the output stage coupled to the output terminal of the second current mirror.

6. The noise reduction circuit of claim 5, wherein the filtering current mirror includes a high pass filter.

7. The noise reduction circuit of claim 1, wherein the second signal path comprises a second integrating analog-to-digital circuit having an input and an output, the input of the second integrating analog-to-digital circuit coupled to the second output of the phase sampling circuit.

8. The noise reduction circuit of claim 1, further comprising:
a light emitting diode driver circuit coupled to the output of the oscillator; and
control logic circuitry coupled to at least the phase sampling circuit and to the light emitting diode driver circuit.

9. A method for reducing noise, comprising:
receiving an electromagnetic radiation signal having a signal component and an ambient component;
separating the electromagnetic radiation signal into the signal component and the ambient component drive signal in response to a stream of pulses of known phase and frequency;
transmitting the signal component and the ambient component along a first signal path and the ambient component along a second signal path; and
subtracting the ambient component from the illuminated component to form an output signal.

10. The method of claim 9, further including receiving electromagnetic radiation in response to a light emitting diode drive signal.

11. The method of claim 10, further including generating a drive signal in response to an oscillator signal and a control signal.

12. The method of claim 11, further including asserting a light emitting diode in response to the drive signal.

13. The method of claim 12, further including sampling the signal component and the ambient component along a first signal path in response to an inverted oscillator signal to generate a first sampled signal.

14. The method of claim 13, further including sampling the signal component and the ambient component after a predetermined time delay.

15. The method of claim 13, further including sampling the ambient component along the second signal path in response to the oscillator signal to generate a second sampled signal.

16. The method of claim 9, further including sampling the signal component and ambient component in response to the drive signal being in an off state.

17. The method of claim 16, further including sampling the ambient component after the drive signal is de-asserted.

18. The method of claim 17, further including delaying sampling the ambient component for a predetermined time after the drive signal is de-asserted.

19. The method of claim 9, wherein transmitting the signal component and the ambient component along a first signal path and the ambient component along a second signal path further includes:
sampling the signal component and the ambient component along the first signal path to generate a first sampled signal;
integrating the first sampled signal to generate a first integrated signal; and
converting the first integrated signal to a first digital signal.

20. The method of claim 9, wherein transmitting the signal component and the ambient component along a first signal path and the ambient component along a second signal path further includes:
sampling the ambient component along a second signal path to generate a first sampled signal;
integrating the first sampled signal to generate a second integrated signal; and
converting the second integrated signal to a second digital signal.

21. A method for reducing noise, comprising:
receiving an electromagnetic radiation signal having a signal component and an ambient component;
in response to a stream of pulses of known phase and frequency sampling the signal component and the ambient component in response to a clock signal to generate a sampled illumination signal;
sampling the ambient component in response to an inverted clock signal to generate a sampled noise signal;
integrating the sampled illumination signal to generate a first integrated signal and converting the first integrated signal into a digital illumination signal;
integrating the sampled ambient to generate a second integrated sampled signal and converting the second integrated sampled signal into a digital ambient signal; and
subtracting the digital ambient signal from the digital illumination signal to generate an output signal.

22. The method of claim 21, further including filtering the electromagnetic radiation signal before sampling the signal component and the ambient component.

23. The method of claim 21, further including using an oscillator to generate the clock signal.

* * * * *